(12) United States Patent
Fürter et al.

(10) Patent No.: US 6,252,712 B1
(45) Date of Patent: Jun. 26, 2001

(54) OPTICAL SYSTEM WITH POLARIZATION COMPENSATOR

(75) Inventors: Gerhard Fürter, Ellwangen; Winfried Kaiser, Aalen; Christian Wagner, Aalen; Michael Gerhard, Aalen; Karl-Heinz Schuster, Königsbronn, all of (DE)

(73) Assignee: Carl-Zeiss-Stiftung, Brenz (DE)

( * ) Notice: Subject to any disclaimer, the term of this patent is extended or adjusted under 35 U.S.C. 154(b) by 0 days.

(21) Appl. No.: 09/252,636

(22) Filed: Feb. 19, 1999

(30) Foreign Application Priority Data

Feb. 20, 1998 (DE) .............................. 198 07 120

(51) Int. Cl.[7] .................................... G02B 5/30
(52) U.S. Cl. .................. 359/499; 359/494; 359/489; 359/900; 356/33; 356/364; 356/365
(58) Field of Search ................. 359/499, 497, 359/494, 489, 72 A, 498, 900, 371, 386; 355/71; 356/364, 365, 366, 367, 351, 33

(56) References Cited

U.S. PATENT DOCUMENTS

| 3,052,152 | * | 9/1962 | Koester | 359/499 |
| 3,663,087 | | 5/1972 | Guillet et al. | 359/251 |
| 3,917,399 | * | 11/1975 | Buzawa et al. | 355/71 |
| 4,408,334 | * | 10/1983 | Lundstrom | 372/98 |
| 4,643,534 | * | 2/1987 | Chun et al. | 359/497 |
| 4,795,246 | * | 1/1989 | Lord | 359/499 |
| 4,902,100 | * | 2/1990 | Reynolds et al. | 359/15 |
| 5,257,092 | * | 10/1993 | Noguchi et al. | 359/367 |
| 5,880,891 | * | 3/1999 | Fürter | 359/651 |
| 5,986,815 | * | 11/1999 | Bryars | 359/494 |
| 6,084,708 | | 7/2000 | Schuster | 359/494 |

FOREIGN PATENT DOCUMENTS

| 196 37 563 A1 | 9/1996 | (DE) | G02B/5/00 |
| 0 764 858 A2 | 8/1996 | (EP) | G02B/5/30 |
| 405107467A | * | 4/1993 | (JP) | 359/494 |

OTHER PUBLICATIONS

V. M. Kozenkov, et al., "Multifinction Light–Polarization Converter", Sov. Tech. Phys. Lett. 6(1), pp. 47–48, Jan. 1980.*

S. B. Papernyi, et al., "Formation of a Smooth Trnasverse Distribution of Intensity in a Light Beam by Phase–Rotating Plate", Sov. J. Qantum Electron. 8((9), pp. 1165–1166, Sep. 1978.*

European Search Report Dec. 5, 1999.

* cited by examiner

Primary Examiner—Cassandra Spyrou
Assistant Examiner—John Juba, Jr.

(57) ABSTRACT

An optical system with at least one optical element that causes a disturbance of the distribution of polarization over the cross section of a light beam wherein at least one birefringent optical element is provided, with a thickness which varies irregularly over the cross section, such that the disturbance of the distribution of polarization is at least partially compensated.

14 Claims, 1 Drawing Sheet

OPTICAL SYSTEM WITH POLARIZATION COMPENSATOR

CROSS-REFERENCES TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

This invention relates to an optical system that is illuminated with light of defined polarization (for example, linearly polarized), in which a locally varying disturbance of the polarization occurs, due among other things to the degree of reflection at the inclined optical boundary surfaces, dependent on the direction of polarization, and to stress birefringence in lenses. After a following analyzer, local variations in brightness appear.

2. Discussion of Relevant Art

A system in which this effect is of importance is projection illumination equipment for microlithography, with a linearly polarized excimer laser in the DUV and a catadioptric reducing objective with a polarization beam splitter, as is known, for example, from German Patent DE 196 16 922 (U.S. Ser. No. 08/845,384 filed Apr. 15, 1997), the said patent being fully incorporated herein by reference.

Compensators are known for the continuously variable rotation of the direction of polarization, e.g. in the form of the Soleil-Babinet compensator, but of course only with uniform action over the whole light beam cross section.

Phase correction plates for wavefront correction in precision optics are known for use in microlithographic projection illumination equipment, and are for example machined with a "nanosphere" fine profile by ion beam etching.

Birefringent crystals of magnesium fluoride and of quartz are suitable for the production of polarization optical elements with transmission in the deep ultraviolet (DUV) at, e.g., 193 nm. Besides this, elements with stress birefringence are also known, e.g. according to German Patent DE 196 37 563.

SUMMARY OF THE INVENTION

The invention has as its object to provide an arrangement with which local disturbances of the state of polarization of light in an optical system can be compensated. In particular, disturbances of homogeneity, which result from polarization disturbances, are to be compensated in optical systems with polarizing beam splitters, such as in catadioptric reducing objectives of the type mentioned hereinabove. In addition, a method of production is provided.

The object is attained by means of an optical system according to the invention with at least one birefringent element with irregularly varying thickness as the polarization compensator. The optical system comprises at least one optical element that causes a disturbance of the distribution of polarization over the cross section of a light beam and at least one birefringent optical element having a thickness that varies irregularly over said cross section, such that the disturbance of the distribution of polarization is at least partially compensated.

An embodiment is particularly preferred in which pairwise birefringent elements are provided with principal axes rotated with respect to each other, preferably through 45°. Polarization disturbances which are actually arbitrary as regards their orientation can thereby be compensated.

Likewise, an arrangement of compensation plates of isotropic material, in an advantageous embodiment of the invention, optimizes the correction. The method of production according to the invention comprises a process for the production of an optical system, comprising finish-mounting and adjusting a partial system, making polarization optical precision measurements of said partial system, locally differently eroding at least a first birefringent optical element corresponding to the polarization optical measurement data, and inserting said first birefringent optical element into the beam path of the optical system behind the partial system.

BRIEF DESCRIPTION OF THE DRAWING

The invention will be described in more detail with reference to the accompanying drawing, in which.

DETAILED DESCRIPTION OF PREFERRED EMBODIMENTS

Figure 1:
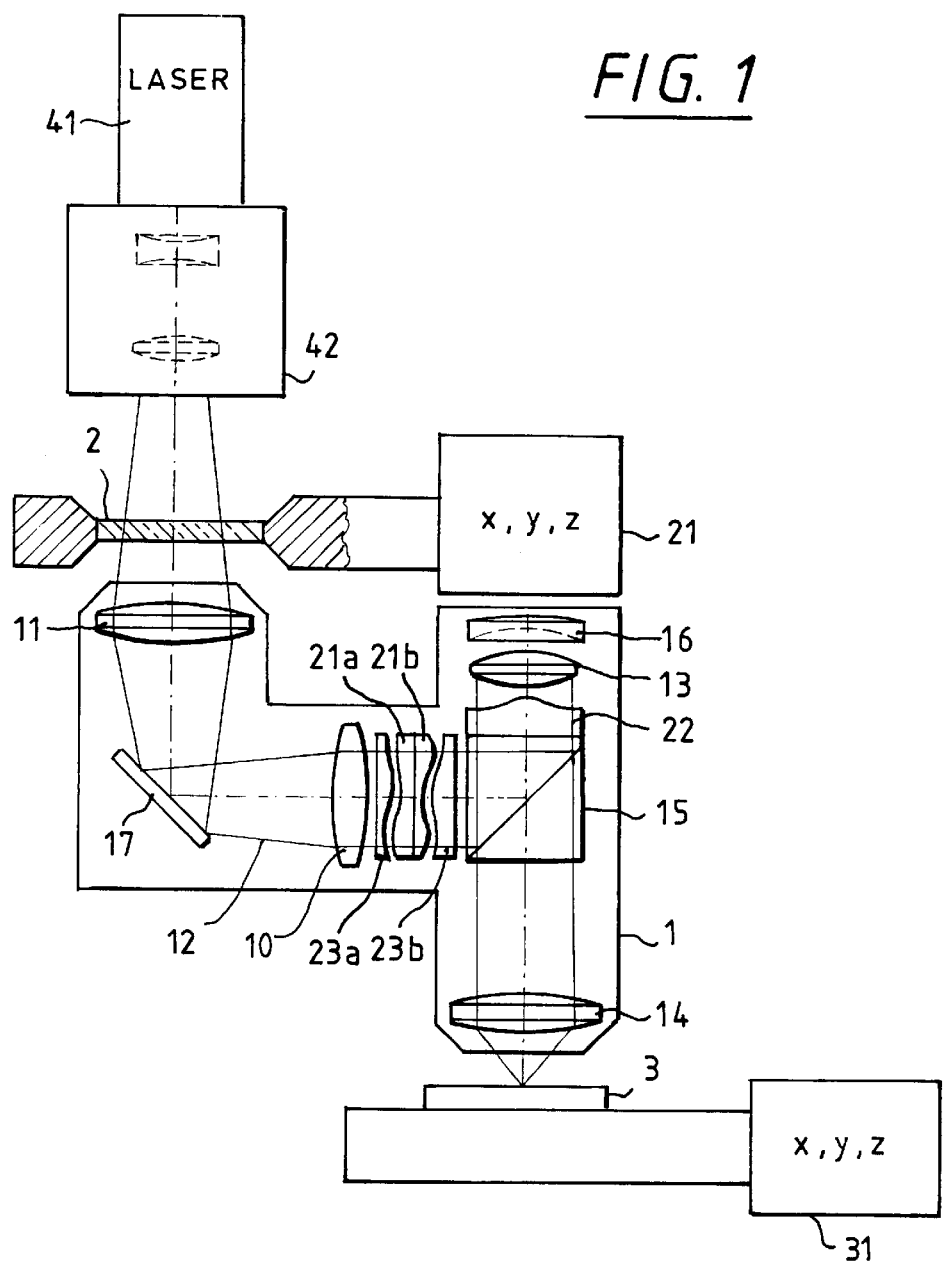
FIG. 1 shows schematically a projection illumination equipment with birefringent polarization correction elements.

The core of the projection illumination equipment according to FIG. 1 is a catadioptric reduction objective 1 which images a mask (reticle) 2 onto a wafer 3, on a reduced scale. The mask 2 and also the wafer 3 are installed on holding and positioning systems 21, 31 which enable the precise positioning and the step and repeat sequence or the step and scan sequence to be carried out.

The mask 2 is suitably illuminated by means of a laser 41, in particular a linearly polarized DUV excimer laser, with a subsequent illumination optics 42.

The reduction objective 1 consists firstly in a known manner of lens groups 11–14, the polarized beam splitter cube 15, the deflecting mirror 17, the concave mirror 16, and a quarter wave plate 22.

A disturbance of the state of polarization with a direction and magnitude which varies locally over the cross section results in the beam path due to manifold influences, stress birefringence among them. The radiation distribution at the polarizing beam splitter is thus inhomogeneous, and the image is distorted when no countermeasures are taken.

According to the invention, birefringent optical elements 21a, 21b (at least one) are provided in the beam path 10 behind the lens groups 11, 12, are irregular in thickness over the cross section, and at least partially compensate the local disturbances of the linear polarization in the beam path 10.

Figure 2:
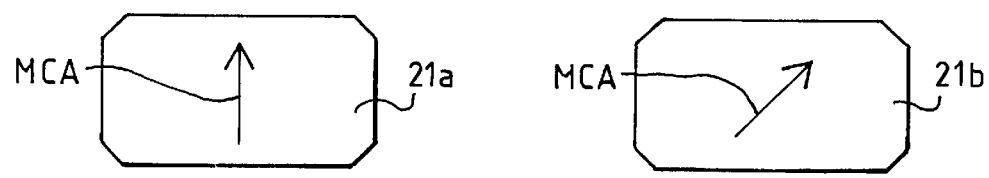
FIG. 2 shows schematically two polarization correction elements with different main axis directions.

For the optimum inclusion and correction of all directions of polarization, two elements 21a, 21b are required, with their principal axes MCA mutually rotated, optimally by 45°, as shown in FIG. 2.

The quarter wave plate 22 is, in the example, also corrected in its thickness and compensates the polarization errors arising in the further beam path, and possibly residual errors. It is to be noted that the light beam 10 passes through it twice.

Plates 23a, 23b of isotropic material (quartz glass) have optically negative shapes to the correction plates 21a, 21b.

The optical path over the whole cross section of the light beam 10 is thereby again equal, so that the wavefront is not disturbed by the combination of the elements 21a, 21b and plates 23a, 23b.

The free form surfaces of the elements 21a, 21b and the plates 23a, 23b can be produced by ion beam processing. The thickness modulation of the elements 21a, 21b or plates 23a, 23b thereby moves by values of up to about 3 µm.

To prevent reflections at the boundary surfaces, the elements 21a, 21b and plates 23a, 23b are united together and with the beam splitter cube 15 without any air gaps, as far as possible. This takes place by wringing or by cementing, the latter of course not in the DUV wavelength region.

For the same reason, the plates 23a, 23b are of isotropic material and are preferably embodied integrally united as a single element.

It is advantageous both as regards production and as regards the exact fitting shape and jointing without gaps, however, if the plates 23a, 23b are produced by the coating of the processed surfaces of the polarization compensator elements 21a, 21b with isotropic material, e.g., the CVD deposition of quartz glass, which in conclusion is optically polished. The residual disturbance of the wavefront resulting from the different indices of refraction can furthermore still be corrected by ion beam or atomic beam processing with smaller height differences.

The quarter wave plate 22 constituted as a polarization correction element is shown only by way of example; here also, combination with an isotropic (amorphous) compensator and constructional unification with neighboring elements, particularly by wringing to the beam splitter cube 15, is appropriate and advantageous.

The shape of the correction surfaces of the elements 21a, 21b, 22 and of the plates 23a, 23b is preferably established individually for each objective. For this purpose, the quality of test illuminations can be evaluated, or the local polarization or the wavefront in the cross section of the light beam 10 can be determined by means of scanning probes.

We claim:

1. An optical system comprising
   at least one optical element (2, 11, 12) that causes a disturbance of the distribution of polarization over the cross section of a light beam (10), and
   at least one birefringent free-form optical element having a thickness that varies irregularly over said cross section such that the disturbance of the distribution of polarization is at least partially compensated.

2. The optical system according to claim 1, further comprising at least two birefringent free-form optical elements with varying thickness and principal axes that are rotated with respect to each other.

3. The optical system according to claim 2, in which said principal axes of said at least two birefringent free-form optical elements are rotated 45° with respect to each other.

4. The optical system according to claim 1, further comprising at least one plate of isotropic material with a thickness varying over said cross section such that disturbances of the wavefront over said cross section are equalized by means of said birefringent optical element.

5. The optical system according to claim 4, in which said at least one plate and said birefringent optical element are united.

6. The optical system according to claim 4, further comprising a polarization beam splitter, in which at least one of said birefringent elements and said plate is constructionally united with said polarization beam splitter.

7. The optical system according to claim 1, further comprising a polarization beam splitter.

8. The optical system according to claim 7, further comprising a catadioptric objective in which said polarization beam splitter is arranged, said birefringent optical element being arranged in the beam path in advance of said polarization beam splitter.

9. The optical system according to claim 7, further comprising a concave mirror in which said birefringent optical element is arranged in a path traversed twice by said light beam between said polarization beam splitter and said concave mirror.

10. A process for the production of an optical system, comprising
    finish-mounting and adjusting a partial system,
    making polarization optical precision measurements of said partial system,
    corresponding to said polarization optical measurement data, locally differently removing material from at least a first birefringent optical element, and
    inserting said first birefringent optical element into the beam path of said optical system behind said partial system.

11. The process according to claim 10, in which material of said first birefringent optical element is locally differently removed by ion beam processing.

12. The process according to claim 10, further comprising locally differently removing material from a second birefringent optical element with principal axis (MCA) rotated with respect to said first birefringent optical element, and inserting said second birefringent optical element into said beam path.

13. The process according to claim 12, further comprising
    producing at least one wavefront compensation plate of isotropic material with a thickness distribution over the cross section of said beam path optically complementary to first and second birefringent free-form optical elements, and
    inserting said at least one wavefront compensation plate in said beam path neighboring said first and said second birefringent free-form optical elements.

14. The process according to claim 10, further comprising
    producing at least one wavefront compensation plate of isotropic material with a thickness distribution over the cross section of said beam path optically complementary to first and second birefringent free-form optical elements, and
    inserting said at least one wavefront compensation plate in said beam path neighboring said first and said second birefringent free-form optical elements.

* * * * *